United States Patent
Sakamoto

(10) Patent No.: US 7,514,364 B2
(45) Date of Patent: Apr. 7, 2009

(54) HYDROPHILICITY TREATMENT METHOD OF A SILICON WAFER

(75) Inventor: Takao Sakamoto, Niigata (JP)

(73) Assignee: Covalent Materials Corporation, Tokyo (JP)

( * ) Notice: Subject to any disclaimer, the term of this patent is extended or adjusted under 35 U.S.C. 154(b) by 0 days.

(21) Appl. No.: 11/709,739

(22) Filed: Feb. 23, 2007

(65) Prior Publication Data

US 2007/0207615 A1 Sep. 6, 2007

(30) Foreign Application Priority Data

Mar. 3, 2006 (JP) ............... 2006-057680

(51) Int. Cl.
*H01L 21/302* (2006.01)
(52) U.S. Cl. ............ 438/694; 438/692; 438/693; 134/1.2
(58) Field of Classification Search .......... 438/691.692, 438/693, 694; 252/79.1, 79.2; 134/1.2, 1.3
See application file for complete search history.

(56) References Cited

U.S. PATENT DOCUMENTS 6,458,012 B1 * 10/2002 Hirokawa et al. .......... 451/5

2003/0041526 A1 * 3/2003 Fujii et al. ................ 51/307
2004/0134873 A1 * 7/2004 Yao et al. ................. 216/2
2006/0032149 A1 * 2/2006 Kim et al. ................. 51/307
2006/0075687 A1 * 4/2006 Tsuruta et al. ............. 51/307
2006/0242912 A1 * 11/2006 Roh et al. ................. 51/308

FOREIGN PATENT DOCUMENTS

JP  2002-217151 A  8/2002

* cited by examiner

*Primary Examiner*—Lan Vinh
(74) *Attorney, Agent, or Firm*—Foley & Lardner LLP

(57) ABSTRACT

In a hydrophilicity treatment method including the step of rotating, on a polishing cloth, a mirror surface of a silicon wafer subjected to mirror-polishing followed by rinsing treatment while the mirror surface is pushed onto the cloth under the application of a small load with the contact of the mirror surface with a hydrophilicity treatment liquid, thereby making the mirror surface hydrophilic, the hydrophilicity treatment liquid is an aqueous liquid which comprises an organic compound having at least one hydrophilic group and having a molecular weight of 100 or more, a basic nitrogen-containing organic compound and a surfactant, and which has a pH of 9.5 to 10.5.

1 Claim, 1 Drawing Sheet

HYDROPHILICITY TREATMENT METHOD OF A SILICON WAFER

BACKGROUND OF THE INVENTION

1. Field of the Invention

The present invention relates to a hydrophilicity treatment method of a silicon wafer, specifically, a method for hydrophilicity treatment of a mirror surface of a silicon wafer subjected to mirror-polishing treatment followed by rinsing treatment.

2. Description of the Related Art

In ordinary silicon semiconductor wafer producing/processing processes, a silicon wafer cut off from a silicon monocrystal ingot undergoes a lapping step and an etching step, and is then subjected to mirror-polishing by use of a polishing agent liquid for making the wafer surface flat and smooth.

Mirror-polishing of a surface is usually performed at two stages of coarse polishing and finish polishing. Finally, by the finish polishing, the micro-roughness of the surface, which is the fine surface roughness thereof, is made better and the haze thereof is removed.

The cleanness of the above-mentioned silicon wafer surface produces a direct effect onto semiconductor device property. It is known that a fall in the cleanness causes a failure of device pattern formation and produces a bad effect onto electrical characteristics of semiconductor devices, and others.

This fall in the cleanness of the wafer substrate surface is mainly caused by alien pollutants adhering onto the wafer substrate surface in individual steps for processing the wafer, examples of the pollutants including particles, metal impurities and organic materials.

For this reason, a final cleaning treatment is conducted after the mirror-polishing step in order to remove the particles and other alien pollutants that remain onto the wafer surface.

In this case, water rinsing treatment has been hitherto conducted after the mirror-polishing in order to make the finish of the final cleaning perfect and constantly give a high cleanness to the surface.

As disclosed in, for example, Japanese Patent Application Laid-Open No. 2002-217151 (hereinafter referred to as Patent Document 1), in such water rinsing treatment, a polishing agent liquid is used to subject a wafer to polishing for finishing mirror-polishing treatment, and subsequently a rinsing liquid is supplied, instead of the above-mentioned polishing agent liquid, onto the polished wafer surface under the application of low pressure or non-pressure in order to remove the polishing agent liquid remaining onto the polished wafer surface and decrease the amount of alien substances brought together with the wafer into a final cleaning step.

After this water rinsing treatment, the wafer is transported into a cleaning device for conducting the final cleaning step while the wafer is kept wet.

Incidentally, the particles and the other pollutants can be decreased to some degree by the above-mentioned water rinsing treatment and cleaning in the cleaning device.

However, the cleaning is insufficient for higher-level wafer-surface-cleaning treatment desired at present.

In particular, the following problem arises: the polished wafer surface becomes very active (hydrophobic surface) by the mirror-polishing treatment therefor; thus, at the stage of water rinsing treatment, the polished wafer surface contacts rinsing water for the rinsing treatment or the polishing cloth, and conversely there arises a problem that particles adheres to the surface.

The particles adhering at the water rinsing treatment are very firm; thus, it is difficult to remove the particles completely even in the final cleaning treatment.

One method for countering this problem is a method of making the above-mentioned hydrophobic wafer surface hydrophilic. It is known that this method can restrain particles or metal ions from being adsorbed firmly onto the wafer surface.

Patent Document 1 discloses a technique of bringing a polishing agent liquid into contact with a wafer subjected to mirror-polishing without subjecting the wafer to any water rinsing treatment, thereby making the wafer mirror surface hydrophilic.

In this case, the polished silicon surface is certainly made hydrophilic, so as to produce an effect sufficient for restraining the adhesion of particles or metal ions.

However, at the final polishing step, the polishing agent liquid is brought into contact with the silicon surface so that colloidal silica contained in this polishing agent liquid aggregates or sticks firmly into the polishing device. Conversely, therefore, the silica causes the silicon surface to be injured when the silicon surface is polished.

The polishing agent sticking into the device induces filter-stuffing in a polishing agent liquid line or pure water line which has circulating function and is fitted to the device. As a result, there is caused a problem that troubles are made in the polishing device.

The inventors have made eager investigations on hydrophilicity treatment wherein no colloidal silica is used but advantages equivalent to those of hydrophilicity treatment using a polishing agent liquid which contains colloidal silica should be produced. As a result, the present invention has been made.

SUMMARY OF THE INVENTION

An object of the invention is to provide a hydrophilicity treatment method of a silicon wafer, wherein a surface of the wafer is made hydrophilic, without generating any injuries caused by the sticking of colloidal silica onto the surface, after the surface is subjected to mirror-polishing, thereby decreasing the adhesion of particles or metals to the surface further.

The present invention has been made to attain the object, and the hydrophilicity treatment method of a silicon wafer according to the invention is a method comprising the step of rotating, on a polishing cloth, a mirror surface of the silicon wafer subjected to mirror-polishing followed by rinsing treatment while the mirror surface is pushed onto the cloth under the application of a small load with the contact of the mirror surface with a hydrophilicity treatment liquid, thereby making the mirror surface hydrophilic, wherein the hydrophilicity treatment liquid is an aqueous liquid which comprises an organic compound having at least one hydrophilic group and having a molecular weight of 100 or more, a basic nitrogen-containing organic compound and a surfactant, and which has a pH of 9.5 to 10.5.

It is preferred that the organic compound, which has at least one hydrophilic group and has a molecular weight of 100 or more, as a constituent of the hydrophilicity treatment liquid is a compound which has at least one hydrophilic group selected from the group consisting of a carboxyl group, a carboxyl derivative group which can form a carboxylic acid salt, a sulfonic acid group and a sulfonic acid derivative group which can form a sulfonic acid salt. It is particularly preferred that the organic compound is selected from the group consisting of an ammonium polycarboxylate organic polymeric compound and an ammonium polysulfonate organic polymeric compound.

It is also preferred that the basic nitrogen-containing compound in the hydrophilicity treatment liquid is at least one selected from the group consisting of an aliphatic amine, an alicyclic amine, a nitrogen-containing heteroalicyclic compound, and an aminoalcohol compound.

It is also preferred that the surfactant in the hydrophilicity treatment liquid is at least one selected from the group consisting of a nonionic surfactant and an amphoteric surfactant.

Furthermore, it is preferred that the hydrophilicity treatment liquid is an aqueous liquid comprising 0.1 to 10% by weight of the organic compound, which has at least one hydrophilic group and has a molecular weight of 100 or more, 0.1 to 10% by weight of the basic nitrogen-containing organic compound, and 0.01 to 0.5% by weight of the surfactant, and which has a pH of 9.5 to 10.5.

In the invention, a hydrophilicity treatment liquid having a specific blend composition as described above is applied onto a mirror surface of a silicon wafer, and then the wafer is rotated while pushed onto a polishing cloth under the application of a small load with the contact of the mirror surface with the treatment liquid. In this way, hydrophilicity treatment effects equivalent to those of the above-mentioned hydrophilicity treatment wherein colloidal silica is used can be attained while the wafer is restrained form being injured. As a result, the amount of alien substances, such as particles, which adhere to the silicon wafer can be further reduced.

When a mirror-polished wafer surface is made hydrophilic by use of the hydrophilicity treatment method according to the invention, the adhesion of alien substances such as particles onto the wafer mirror surface can be further decreased while the wafer surface is restrained from being injured.

Moreover, according to the invention, the hydrophilicity treatment agent does not stick into the polishing device, thereby making it possible to decrease remarkably the generation frequency of troubles, such as filter-stuffing in a polishing agent liquid line or pure water line which has circulating function and is fitted to the device.

DESCRIPTION OF THE PREFERRED EMBODIMENTS

Figure 1:
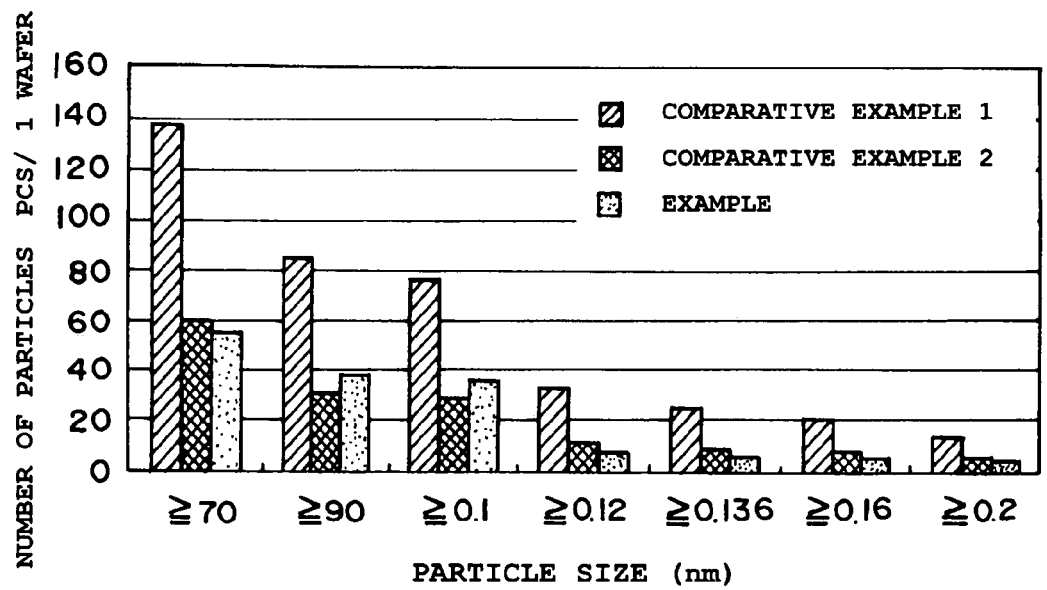
FIG. 1 is a graph showing the average value of the numbers of particles adhering onto individual mirror surfaces of wafers in each of treatment embodiments in Example, and Comparative Examples 1 and 2.

The present invention will be described in more detail and specifically hereinafter.

As described above, the hydrophilicity treatment method of a silicon wafer according to the invention is a method comprising the step of rotating, on a polishing cloth, a mirror surface of a silicon wafer subjected to mirror-polishing followed by rinsing treatment while the mirror surface is pushed onto the cloth under the application of a small load with the contact of the mirror surface with a hydrophilicity treatment liquid, thereby making the mirror surface hydrophilic, wherein the hydrophilicity treatment liquid is an aqueous liquid which comprises an organic compound having at least one hydrophilic group and having a molecular weight of 100 or more, a basic nitrogen-containing organic compound and a surfactant, and which has a pH of 9.5 to 10.5.

The hydrophilicity treatment liquid in the invention is preferably an aqueous liquid comprising 0.1 to 10% by weight of the organic compound, 0.1 to 10% by weight of the basic nitrogen-containing organic compound, and 0.01 to 0.5% by weight of the surfactant, and which has a pH of 9.5 to 10.5.

In the hydrophilicity treatment method of the invention, the wafer mirror surface to be treated is slightly etched, and in the etched surface a soft and very thin silica hydration film would be formed. Therefore, in the method of the invention, which is different from the conventional treatment method, wherein a polishing agent liquid containing colloidal silica is brought into contact with a wafer mirror surface, injuries are not generated at all in the wafer mirror surface, and further hydrophilicity treatment effects equivalent to those of the abovementioned conventional treatment, wherein a polishing agent liquid containing colloidal silica is used, can be attained. As a result, the invention produces an advantageous effect that alien substances, such as particles, adhering to the silicon wafer are further decreased.

"Hydrophilicity Treatment Liquid"

The organic compound, which has at least one hydrophilic group and has a molecular weight of 100 or more, as one of the constituents of the hydrophilicity treatment liquid used in the method of the invention fulfills a function of adjusting the viscosity of the hydrophilicity treatment liquid. Specifically, when an appropriate amount of the organic compound is incorporated into the other components of the treatment liquid, the treatment liquid is kept into the state of a Newtonian viscous fluid and further the viscosity thereof is adjusted into an appropriate range of about 20 to 30 cP.

This way makes it possible to control the adhesion of the treatment liquid onto the polishing cloth, the permeability into the gap between the polishing cloth and the wafer surface, and other properties into preferred scopes.

The organic compound fulfills a function of buffering and adjusting the pH value of the treatment liquid, as well as the above-mentioned function.

When the treatment liquid is applied to the wafer, the organic compound interacts strongly onto the wafer mirror surface. Thus, when this compound covers the mirror surface, the organic compound contributes to the formation of a very thin and soft hydration film onto the whole of the wafer mirror surface.

The organic compound is preferably a compound which has at least one hydrophilic group selected from the group consisting of a carboxyl group, a carboxyl derivative group which can form a carboxylic acid salt (for example, which has a terminal such as Na or —$NH_4$), a sulfonic acid group, and a sulfonic acid derivative group which can form a sulfonic acid salt (for example, which has a terminal such as Na or —$NH_4$).

Specific examples of the compound include ammonium polycarbonate organic polymeric compounds such as an ammonium salt of poly(meth)acrylic acid, an ammonium salt of ethylene/(meth)acrylic acid copolymer, an ammonium salt of ethylene/maleic anhydride copolymer, and an ammonium salt of poly(meth)acrylic acid/(meth) acrylic acid ester copolymer; and ammonium polysulfonate organic polymeric compounds such as an ammonium salt of phenol/sulfonic acid polymer, and an ammonium salt of styrene/divinylbenzene/sulfonic acid polymer.

The molecular weight of the ammonium polycarbonate (or polysulfonate) organic polymeric compounds is 100 or more, preferably 500 or more. Furthermore, the molecular weight is preferably 3000 or less from the viewpoint of uniform solubility thereof in the treatment liquid and uniform dispersibility thereof in the treatment liquid.

Secondarily, the basic nitrogen-containing organic compound, as another of the constituents of the hydrophilicity treatment liquid used in the method of the invention, mainly fulfills a function of adjusting the pH of the treatment liquid into a proper alkaline range, thereby producing an effect of promoting the formation of the above-mentioned hydration film on the wafer mirror surface.

Specific examples of the basic nitrogen-containing organic compound include aliphatic amines or polyamines such as methylamine, ethylamine, (i-, or n-)propylamine, (i-, n-, ort-) butylamine, pentylamine, hexylamine, diethylamine, di(i-, or n-)propylamine, di(i-, n-, or t-)butylamine, triethylamine, tri (i-, or n-)propylamine, tri(i-, or n-)butylamine, ethylenediamine, trimethylenediamine, tetramethylenediamine, trimethylenetriamine, diethylenetriamine, and triethylenetetramine; alicyclic amines or polyamines such as cyclopentylamine, cyclohexylamine, cycloheptylamine, cyclooctylamine, cyclopentanediamine, cyclohexanediamine, and cyclopentamine; nitrogen-containing heteroalicyclic compounds such as piperidine, and piperazine; aminoalcohol compounds such as α-oxyethylamine(α-aminoethylalcohol), monoethanolamine(β-aminoethylalcohol), aminoethylethanolamine, and triethanolamine; and any combination of two or more out of these examples.

Of these basic nitrogen-containing organic compounds, ethylenediamine, monoethanolamine, 1,6-hexanediamine, piperazine, or a combination of ethylenediamine and monoethanolamine is preferred.

The surfactant, as still another of the constituents of the hydrophilicity treatment liquid used in the method of the invention, produces an effect of dissolving or dispersing the organic polymeric compound, such as the ammonium polycarbonate or the ammonium polysulfonate, and the amine(s) uniformly into the treatment liquid and further lowering the surface tension of the treatment liquid to improve the wettability of the treatment liquid into the polishing cloth, the permeability thereof into the gap between the polishing cloth and the wafer surface, the wettability thereof onto the wafer mirror surface, and other properties.

The surfactant is not particularly limited, and may be any surfactant such as a water-soluble anionic surfactant, a water-soluble nonionic surfactant, or a water-soluble amphoteric surfactant. It is preferred to use a water-soluble nonionic surfactant, or a water-soluble amphoteric surfactant in order to restrain the pollution of the wafer mirror surface with metal ions.

Examples of the water-soluble nonionic surfactant include polyoxyethylene alkyl ether, a pruonic nonionic surfactant which is an adduct reactant of ethylene oxide and propylene oxide, a plyoxyethylene ester of an aliphatic acid, a polyoxyethylenesorbitan ester of an aliphatic acid, polyoxyethylene castor oil, a saccharose ester of an aliphatic acid, and polyoxyethylene/oxypropylene alkyl ether.

Specific examples thereof include a polyethylene glycol ester of diluaric acid, tridecylpolyoxyethylene ether, nonylphenyl polyoxyethylene ether, and polyethylene glycol monostearate. Such compounds having a HLB (hydrophile-lipophile balance) of 10 or more are preferred.

Examples of the amphoteric surfactant include N-alkylsulfobetaine modified silicone oil, N-alkylnitrilotriacetic acid, N-alkyldimethylbetaine, α-trimethylammoniofatty acid, N-alkyl-β-aminopropionic acid, N-alkyl-β-iminodipropionic acid salts, N-alkyloxymethyl-N,N-diethylbetaine, 2-alkylimidazoline derivatives, and N-alkylsulfobetaine.

The hydrophilicity treatment liquid in the invention is preferably an aqueous liquid which comprises 0.1 to 10% by weight, preferably 0.5 to 5% by weight of the organic compound, such as the ammonium polycarboxylate organic polymeric compound or ammonium polysulfonate organic polymeric compound, 0.1 to 10% by weight, preferably 0.5 to 5% by weight of the basic nitrogen-containing organic compound, such as the aliphatic amine, alicyclic amine, nitrogen-containing heteroalicyclic compound, or aminoalcohol compound, and 0.01 to 0.5% by weight, preferably 0.05 to 0.1% by weight of the surfactant, such as the water-soluble nonionic surfactant or water-soluble amphoteric surfactant, and which has a pH of 9.5 to 10.5, preferably 9.8 to 10.0 in order to etch the wafer mirror surface appropriately to form a homogeneous hydration film on the whole and make the mirror surface hydrophilic with satisfaction.

If the pH is more than 10.5, the wafer mirror surface is excessively etched with the treatment liquid at the time of the hydrophilicity treatment. Thus, the wafer surface is made rough.

If the pH is less than 9.5, the etching hardly advances so that the wafer mirror surface is not sufficiently made hydrophilic.

In the hydrophilicity treatment liquid in the invention, a single species or plural species of functional water are preferably used as water. The functional water is water which is made mainly of superpure water and is subjected to a specific treatment. Various species thereof can be selected, which each have a characteristic that particles are removed, metal impurities are removed, organic materials are removed or a naturally oxidized film is removed, or some other characteristic. Specific examples thereof include megasonic radiated superpure water, ozone-added superpure water, electrolytic anode water, low dissolved-oxygen water, and electric resistance adjusted water. The functional water may be water made of any combination of two or more selected from the above-mentioned megasonic radiated superpure water, ozone-added superpure water, electrolytic anode water, low dissolved-oxygen water, and electric resistance adjusted water.

The hydrophilicity treatment liquid in the invention may comprise a water-soluble organic solvent such as an alcohol as long as the property of the liquid is not damaged.

The solvent acts as a dissolution-aiding agent for the above-mentioned organic polymer such as the ammonium salt of ethylene/(meth)acrylic acid copolymer, the ammonium salt of styrene/divinylbenzene/sulfonic acid polymer, and the nitrogen-containing heteroalicyclic compound such as piperazine.

Examples of the alcohol include aliphatic alcohols having 1 to 6 carbon atoms, such as methanol, ethanol, isopropanol, propanol, isobutanol, butanol, and sec-butanol.

"Hydrophilicity Treatment Method of a Mirror Surface of a Wafer"

In the hydrophilicity treatment method of a mirror surface of a (silicon) wafer according to the invention, after the wafer is subjected to mirror-polishing followed by rinsing treatment, the above-mentioned hydrophilicity treatment liquid is caused to flow toward the wafer, and further the mirror surface of the wafer is rotated (usually, the rotation number: 5 to 20 rpm) on a polishing cloth while the mirror surface is pushed onto the cloth under the application of a small load, for example, a surface pressure of about 5 Pa or less with the contact of the mirror surface with the treatment liquid, thereby etching the wafer mirror surface very slightly to form a thin and soft hydration film on the etched surface. In this way, the mirror surface is made hydrophilic.

The polishing cloth (or a pad) to be used may be made of the same material as used in a finish polishing step for the mirror-polishing of any silicon wafer. Thus, the material may be a material having a hardness of about 40 to 60 degrees, and a thickness of about 0.8 to 1.5 mm, for example, a nonwoven cloth (such as artificial leather), a nonwoven cloth impregnated with resin, foamed polyurethane, or porous fluorine-contained resin.

As described above, in the hydrophilicity treatment method of a silicon wafer according to the invention, it is possible to restrain the generation of injuries in the wafer, as is seen in the prior art, based on the sticking of colloidal silica, and so on. Furthermore, the surface of the silicon wafer can be made hydrophilic, as is desired.

Moreover, the polishing agent sticking onto the polishing device is decreased, so that filter-stuffing in a polishing agent line or pure water line which has circulating function is also decreased. Thus, troubles in the polishing device based on the stuffing are not caused, either.

EXAMPLES

Prepared were 8 wafers subjected to an ordinary mirror-polishing treatment but not subjected to any hydrophilicity treatment (Comparative Example 1); 8 wafers subjected to the hydrophilicity treatment according to the method described in "First Embodiment" in Patent Document 1, wherein an ordinary polishing agent liquid containing colloidal silica was used (Comparative Example 2); and 8 wafers subjected to a hydrophilicity treatment according to the method of the invention (Example). About each of Comparative Examples 1 and 2, and Example, the number of particles adhering onto the mirror surface was obtained about each of the 8 wafers. The average of the resultant numbers of the particles adhering to the individual wafer mirror surfaces was obtained (the particle number per wafer). The results are shown in FIG. 1.

In Example, wherein the method of the invention was used, the used hydrophilicity treatment liquid was an aqueous solution comprising 6% by weight of ammonium polyacrylate, 0.5% by weight of ethylenediamine, 0.05% by weight of monoethanolamine, and 0.4% by weight of a dilauric acid ester of polyethylene glycol. A device (polishing cloth: a nonwoven cloth impregnated with resin, hardness: 45, and thickness: 1.2 mm) having the same structure as the used polishing device was used to rotate each of the silicon wafers (diameter: 200 mm, and thickness: 725 μm) subjected to mirror-polishing and rinsing treatment (rotation number: 20 rpm/m) on the polishing cloth for several seconds while the wafer was pushed onto the cloth under the application of a load (surface pressure: 4 Pa) with the contact of the mirror surface with the above-mentioned treatment liquid. In this way, the mirror surface was made hydrophilic.

In Comparative Example 2, the used polishing liquid was a slurry comprising 3.5% by weight of colloidal silica, 0.3% by weight of ethylene diamine, and 0.02% by weight of monoethanolamine and having a pH of 11.5. The method of Comparative Example 2 was carried out in accordance with the "First Embodiment" described in Patent Document 1.

As is understood in FIG. 1 also, the number of the particles on the mirror surface of each of the wafers treated in accordance with the method of the invention was evidently smaller than that in the example wherein no hydrophilicity treatment was conducted (Comparative Example 1), and the number was equivalent to that in the example wherein the hydrophilicity treatment with the ordinary polishing agent was conducted (Comparative Example 2).

Figure 2:
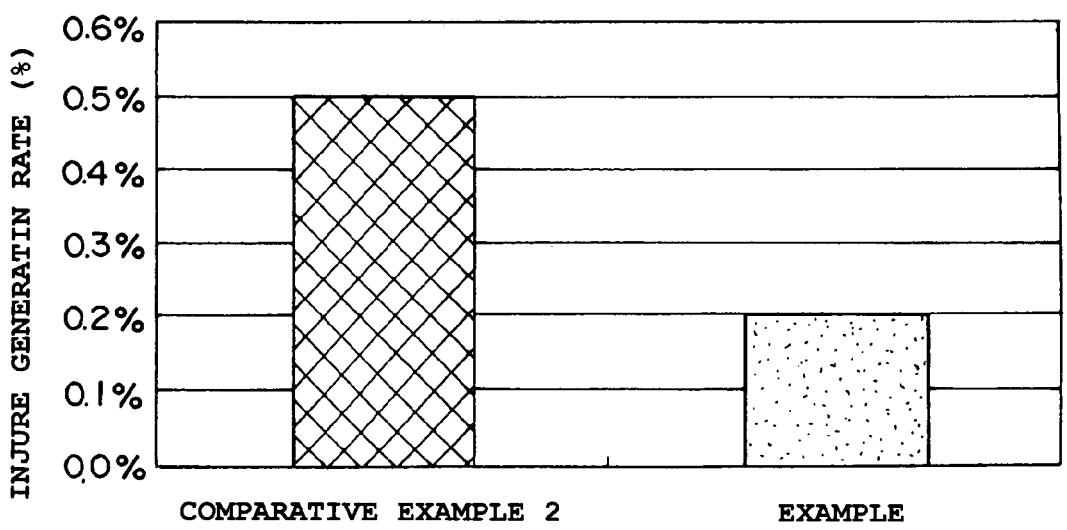
FIG. 2 is a graph showing the generation rate of injuries in the wafer surface of each of Example and Comparative Example 2.

In FIG. 2 is shown the generation rate of injuries in the wafer surface in each of the examples wherein the hydrophilicity treatment was conducted.

These examples are compared with the example wherein the hydrophilicity treatment with the ordinary polishing agent was conducted (Comparative Example 2). As a result, in the former examples, the generation of the injuries in the surface of the silicon wafer was decreased.

What is claimed is:

1. A hydrophilicity treatment method, comprising the steps of:
    providing a wafer subjected to mirror-polishing followed by a rinsing treatment, the wafer comprising a mirror surface;
    flowing a hydrophilicity treatment liquid toward the wafer;
    applying a surface pressure of about 5 Pa or less on the mirror surface to contact the mirror surface to a polishing cloth;
    rotating the mirror surface on the polishing cloth; and
    forming a thin and soft hydration film on the mirror surface;
    wherein the hydrophilicity treatment liquid is an aqueous liquid comprising an organic compound having at least one hydrophilic group and having a molecular weight of 100 or more, a basic nitrogen-containing organic compound, and a surfactant, and
    wherein the hydrophilicity treatment liquid has a pH of 9.5 to 10.5.

* * * * *